(12) United States Patent
Xia

(10) Patent No.: US 11,675,275 B2
(45) Date of Patent: Jun. 13, 2023

(54) POSITIONING METHOD AND APPARATUS FOR PARTICLES ON RETICLE, STORAGE MEDIUM, AND ELECTRONIC DEVICE

(71) Applicant: CHANGXIN MEMORY TECHNOLOGIES, INC., Hefei (CN)

(72) Inventor: Shuang Xia, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 7 days.

(21) Appl. No.: 17/575,798

(22) Filed: Jan. 14, 2022

(65) Prior Publication Data

US 2022/0137521 A1 May 5, 2022

Related U.S. Application Data

(63) Continuation of application No. PCT/CN2021/101817, filed on Jun. 23, 2021.

(30) Foreign Application Priority Data

Sep. 29, 2020 (CN) .......................... 202011052988.8

(51) Int. Cl.
*G03F 7/20* (2006.01)

(52) U.S. Cl.
CPC ...... *G03F 7/70608* (2013.01); *G03F 7/70491* (2013.01); *G03F 7/70925* (2013.01)

(58) Field of Classification Search
CPC ............ G03F 7/70491; G03F 7/70533; G03F 7/70541; G03F 7/70608; G03F 7/70916; G03F 7/70925; G03F 7/7085; G03F 7/70866; G03F 7/70975; G03F 1/84
See application file for complete search history.

(56) References Cited

U.S. PATENT DOCUMENTS

| | | | |
|---|---|---|---|
| 8,456,625 B2 | 6/2013 | Anderson | |
| 10,866,197 B2 | 12/2020 | Tolani et al. | |
| 2005/0010890 A1* | 1/2005 | Nehmadi | G03F 1/36 700/121 |

(Continued)

FOREIGN PATENT DOCUMENTS

| | | |
|---|---|---|
| CN | 107632495 A | 1/2018 |
| CN | 106933062 B | 3/2019 |

(Continued)

*Primary Examiner* — Peter B Kim
(74) *Attorney, Agent, or Firm* — Cooper Legal Group, LLC

(57) ABSTRACT

A positioning method for particles on a reticle includes: data of positions passed by a target reticle within a preset period of time is determined according to path data of the target reticle that includes particle information of the target reticle at each scan moment; position information of the target reticle when particles are present on a surface of the target reticle is determined according to the data of positions, to obtain target position data of the target reticle; reticle position data of the target reticle within adjacent scan moments is determined according to the target position data, and a particle source position of the particles on the surface of the target reticle is determined from the reticle position data according to position priorities; and a particle position analysis report of the target reticle within the preset period of time is generated according to the particle source position.

16 Claims, 11 Drawing Sheets

(56) References Cited

U.S. PATENT DOCUMENTS

2010/0029021 A1    2/2010   Anderson
2014/0226136 A1    8/2014   Gagnon
2020/0096862 A1    3/2020   Tolani et al.

FOREIGN PATENT DOCUMENTS

| CN | 110788853 A | 2/2020 |
| CN | 111197994 A | 5/2020 |
| JP | H10161298 A | 6/1998 |

* cited by examiner

POSITIONING METHOD AND APPARATUS FOR PARTICLES ON RETICLE, STORAGE MEDIUM, AND ELECTRONIC DEVICE

CROSS-REFERENCE TO RELATED APPLICATIONS

This application is a continuation of International Application No. PCT/CN2021/101817, filed on Jun. 23, 2021, which claims priority to Chinese patent application No. 202011052988.8, filed on Sep. 29, 2020. The disclosures of International Application No. PCT/CN2021/101817 and Chinese patent application No. 202011052988.8 are hereby incorporated by reference in their entireties.

TECHNICAL FIELD

The disclosure relates to the technical field of semiconductors, and in particular to a positioning method for particles on a reticle, a positioning apparatus for particles on a reticle, a computer-readable storage medium, and an electronic device.

BACKGROUND

Lithography is an important step in a manufacturing process of semiconductor devices, a reticle is an important device for implementing lithography technology, and quality of the reticle directly affects yield of semiconductor products.

In practical applications, the reticle easily adsorbs particles such as dust, which affects transfer quality of a reticle pattern on a wafer, resulting in a decrease in product yield. At present, during an exposure process in lithography processing, since sources of particles on the reticle cannot be tracked and positioned, operators can only use an Intelligent Reticle Inspection Station (IRIS) to inspect the reticle after each exposure. If particles are found on the reticle, all wafers within the lithography processing are reworked. This method greatly increases manufacturing cost of the semiconductor products. Because a position source of the particles on the reticle cannot be determined, the wafers may still need to be reworked in the next exposure, which also consumes more resources and labor cost.

Therefore, a method that can effectively detect sources of dust particles on the reticle is required.

SUMMARY

According some embodiments, a first aspect of the disclosure provides a positioning method for particles on a reticle. The method includes: data of positions passed by a target reticle within a preset period of time is determined according to path data of the target reticle, the data of positions including particle information of the target reticle at each scan moment; position information of the target reticle when particles are present on a surface of the target reticle is determined according to the data of positions, so as to obtain target position data of the target reticle; reticle position data of the target reticle within adjacent scan moments is determined according to the target position data, and a particle source position of the particles on the surface of the target reticle is determined from the reticle position data according to position priorities; and a particle position analysis report of the target reticle within the preset period of time is generated according to the particle source position of the target reticle.

According some embodiments, a second aspect of the disclosure provides a positioning apparatus for particles on a reticle. The apparatus includes: a first determination circuit, configured to determine data of positions passed by a target reticle within a preset period of time according to path data of the target reticle, the data of positions including particle information of the target reticle at each scan moment; a second determination circuit, configured to determine position information of the target reticle when particles are present on a surface of the target reticle according to the data of positions, so as to obtain target position data of the target reticle; a third determination circuit, configured to determine reticle position data of the target reticle within adjacent scan moments according to the target position data, and determine a particle source position of the particles on the surface of the target reticle from the reticle position data according to position priorities; and a generation circuit, configured to generate a particle position analysis report of the target reticle within the preset period of time according to the particle source position of the target reticle.

According to some embodiments, a third aspect of the disclosure provides an electronic device, including: a processor; and a memory configured to store instructions executable by the processor. The processor is configured to perform the following operations by executing the instructions: determining data of positions passed by a target reticle within a preset period of time according to path data of the target reticle, the data of positions comprising particle information of the target reticle at each scan moment; determining position information of the target reticle when particles are present on a surface of the target reticle according to the data of positions, so as to obtain target position data of the target reticle; determining reticle position data of the target reticle within adjacent scan moments according to the target position data, and determining a particle source position of the particles on the surface of the target reticle from the reticle position data according to position priorities; and generating a particle position analysis report of the target reticle within the preset period of time according to the particle source position of the target reticle.

BRIEF DESCRIPTION OF THE DRAWINGS

The accompanying drawings herein are incorporated in and constitute a part of the specification, illustrate implementation modes consistent with the disclosure, and are used to explain the principle of the disclosure, together with the specification. Apparently, for those skilled in the art, the drawings in the following description are only some implementation modes of the disclosure, and other drawings may also be obtained from these drawings without involving any inventive effort.

DETAILED DESCRIPTION

Exemplary implementation modes will now be described more comprehensively with reference to the accompanying drawings. However, the exemplary implementation modes can be implemented in various forms and should not be construed as limited to the examples set forth herein; rather, these implementation modes are provided so that the disclosure will be more thorough and complete, and will fully convey the concept of the exemplary implementation modes to those skilled in the art. The described features, structures, or characteristics may be combined in one or more implementation modes in any suitable manner.

During an exposure process of a wafer, a reticle needs to be placed in a lithography machine, and exposure processing of the wafer is completed through the lithography machine. In actual production, the lithography machine often needs to move or replace the reticle according to wafer etching requirements. However, during moving, particles in an internal or external environment of the lithography machine are easy to contaminate a surface of the reticle, resulting in a decrease in wafer yield and an increase in manufacturing cost, labor cost, and the like. Therefore, during the exposure process, source positions of the particles on the reticle are required to be accurately positioned, so that an operator can clean up a corresponding position, such as the internal or external environment of the machine, in time according to the source positions of the particles, thereby avoiding causing more waste of resources.

In view of one or more of the foregoing problems, the exemplary implementation mode of the disclosure first provides a positioning method for particles on a reticle. For example, the method may be executed by servers in the background of the lithography machine, so that it can determine source positions of particles on a target reticle by obtaining path data of the target reticle.

The target reticle may be any one or more of reticles. During processing of the wafer, the same reticle may be moved in the same type of lithography machines, that is, the same reticle may pass through a plurality of lithography machines. The path data may refer to data of paths and positions of the target reticle moving in one or more of lithography machines, and the like. In addition, it is to be understood that according to actual requirements, the number of serves in the background of the lithography machine may be any number. For example, the server may be a server cluster composed of a plurality of servers, or the like.

Figure 1:
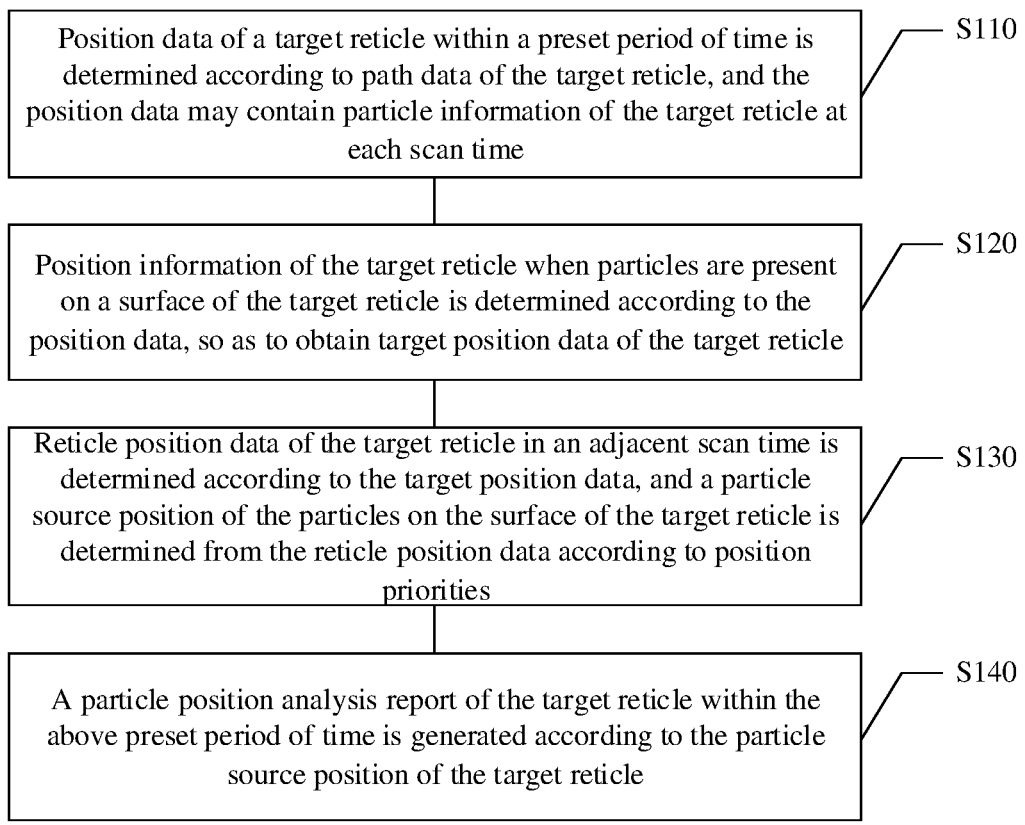
FIG. 1 shows a flowchart of a positioning method for particles on a reticle according to an exemplary implementation.

FIG. 1 shows a flow of an exemplary implementation mode, which may include the following steps of S110 to S140.

At S110, data of positions passed by a target reticle within a preset period of time is determined according to path data of the target reticle, and the data of positions may contain particle information of the target reticle at each scan moment.

The preset period of time may be a time period within which particle sources are present on the target reticle that needs to be analyzed. Generally, it can be set according to use of the target reticle and experience of an operator. For example, it can be set to 36 hours, 24 hours, 12 hours, or the like. The scan moment may be a time point when a surface of the target reticle is inspected at an inspection site inside a lithography machine when the target reticle is moved in or out of the machine, or a time point when the reticle is inspected outside the lithography machine. The data of positions passed by the target reticle refers to position data formed by position information of the target reticle at each moment within the above preset period of time. The data of positions may also include particle information obtained by inspecting the target reticle at the inspection site at each scan moment, e.g., whether particles are present on the surface of the target reticle at a corresponding scan moment. For example, if the target reticle at moment t1 is located outside the lithography machine (such as on a load port), when the target reticle at moment t2 is located at the detection site in the lithography machine at a certain scan moment, and the lithography machine detects that particles are present on the surface of the target reticle at this time, the above position information may be saved as {t1: outside the machine; t2: scan point of the machine (particles are present)}.

Generally, the path data of the target reticle may be stored in a specific database or data platform. By indexing the reticle number of the target reticle in the database or data platform, the path data of the target reticle can be obtained. Further, the path data within the preset period of time may be screened in the path data in chronological order, so that the data of positions passed by the target reticle within the preset period of time may be obtained. Or query conditions may also be set according to information such as the reticle number of the target reticle and the preset period of time. When the preset period of time is reached, a server in the background of the lithography machine can automatically obtain the path data of the target reticle within the preset period of time, and obtain the data of positions passed by the target reticle.

At S120, position information when particles are present on a surface of the target reticle is determined according to the above data of positions, so as to obtain target position data of the target reticle.

The particles may be dust particles of any specification. Considering actual application conditions, the above particles may also be dust particles larger than a certain specification, for example, may be dust particles of a size larger than 100 nanometers.

In the exemplary implantation mode, position information of the target reticle at each moment may be determined according to the above data of positions, and the position information when particles are present on the surface of the target reticle may be determined according to the position information at each moment, so as to obtain the target position data of the target reticle. For example, position information at each moment in the above data of positions can be sequentially judged in chronological order to determine a corresponding scan moment when particles are present on the surface of the target reticle, so as to determine, the position information and time information and the like at the scan moment, as target position data.

In the above data of positions, whether particles are present on the surface of the target reticle may be determined according to the data of positions of the target reticle at the corresponding scan moment. When it is determined that particles are present on the surface of the target reticle, the data of positions of the target reticle within a time period constituted by corresponding scan moments may be determined as the target position data of the target reticle. For example, when it is determined that particles are present on the target reticle at corresponding scan moments according to the data of positions, the data of positions within a time period constituted by adjacent scan moments may be determined as the target position data.

In a process of etching the wafer through the lithography machine, the reticle may be frequently moved at various positions of the lithography machine. In order to improve efficiency of determining positions of particles present on the surface of the target reticle, in an alternative implementation mode, S120 may be implemented by the following ways.

Whether particles are present on the surface of the target reticle at each scan moment is determined according to the above data of positions.

When it is determined that particles are present on the target reticle at a corresponding scan moment, position information of the target reticle at the scan moment is determined, so as to obtain the target position data of the target reticle.

By reading position information at each scan moment from the above data of positions, whether particles are present on the surface of the target reticle at the corresponding scan moment is determined, so that when it is determined that particles are present on the surface of the target reticle at a certain scan moment, the position information of the target reticle at the scan moment is determined, so as to obtain position information at all scan moments and each scan moment when particles are present on the surface of the target reticle, serving as target position data of the target reticle. For example, assuming that data of positions of the target reticle at each moment is $X=\{x^1, x^2, x^3, x^4 \ldots x^n\}$, then data of positions of the target reticle at each scan moment may be $XIR=\{x^1 IR_1, x^2 IR_2, x^3 IR_3, x^4 IR_4 \ldots X^n IR_n\}$, where $IR_i$ indicates whether the target reticle is within a scan moment at moment i, when the target reticle is not within the scan moment, $IR_i=0$, on the contrary, when the target reticle is within the scan moment, $IR_i=1$. Therefore, according to the data of positions XIR of the target reticle at each scan moment, the data of positions when particles are present on the surface of the target reticle at each scan moment can be determined, that is, target position data $XIRIS=\{x^1 IR_1 IS_1, x^2 IR_2 IS_2, x^3 IR_3 IS_3, x^4 IR_4 IS_4 \ldots X^n IR_n\}$, where $IS_i$ indicates whether particles are present on the surface of the target reticle at a moment i. When no particles are present on the surface of the target reticle, $IS_i=0$, on the contrary, when particles are present on the surface of the target reticle, $IS_i=1$, where i may be a positive integer less than or equal to n, and n may be a positive integer greater than or equal to 1.

Specifically, taking actual position data of the target reticle within the preset period of time as an example, data of positions of the target reticle at each moment is X={robot, IRIS(ok), robot, library, robot, IRIS(NG), robot, IRL, Robot, IRIS(ok), Turrent robot, stage, Turrent robot, robot, IRL, robot, IRIS(ok), robot}, where robot is a mechanical arm, IRIS(ok) indicates that the no particles are present on the surface of the target reticle during scanning, and the library refers to an external environment, for example, a position of a reticle loading stage on a lithography machine, i.e., Reticle load port, IRIS(NG) indicates that particles are present on the surface of the target reticle during scanning, that is, the target reticle is abnormal, the IRL indicates a place, for storing the target reticle, inside the machine, the stage represents a loading stage on which the target reticle is placed inside the lithography machine during exposure, Turrent robot represents a mechanical arm that places the target reticle on the stage or takes it out of the stage. Data of positions of the target reticle at each scan moment is XIR=(0,IRIS(ok),0,0,0,IRIS(NG),0,0,0,IRIS(ok),0,0,0,0,0, 0,IRIS(ok),0}, further, the data of positions when particles are present on the surface of the target reticle, that is, the target position data is XIRIS={0,0,0,0,0,IRIS(NG),0,0,0, 0,0,0,0,0,0,0,0,0}.

At S130, reticle position data of the target reticle within adjacent scan moments is determined according to the above target position data, and a particle source position of the particles on the surface of the target reticle are determined from the above reticle position data according to position priorities.

The position priority may be used to indicate the possibility that particles on the target reticle come from various positions. The higher the priority, the higher the probability that the particles on the target reticle come from corresponding positions, conversely, the lower the probability that the particles on the target reticle come from the corresponding position.

Since the target position data may include scan moments when particles are present on the surface of the target reticle and position information at each scan moment, reticle position data, at adjacent scan moments, i.e., within a time period formed by two adjacent scan moments, of the target reticle may be determined according to the target position data, and the particle source position of the target reticle may be determined according to a preset position priority of particle sources.

Specifically, when there are many positions of particle sources or the data of positions within the adjacent scan moments is relatively large, in an alternative implementation mode, S130 may also be implemented by the following ways.

Position information of the target reticle at each moment of the adjacent scan moments is determined according to the above target position data, to obtain reticle position data of the target reticle.

Candidate particle source positions are determined from the above reticle position data, so as to determine a position with a highest priority, among the candidate source positions, as the above particle source position.

In the above target position data, position information at various scan moments may be sequentially read in scanning order, position data of the target reticle at each moment of any two adjacent scan moments may be determined, so as to obtain reticle position data of the target reticle at each scan moment, candidate particle source positions may be determined from the reticle position data, and a position with a highest priority, among the candidate source positions, may be determined as the particle source position. For example, for data of positions of the target reticle at each moment is X={robot, IRIS(ok), robot, library, robot, IRIS(NG), robot, IRL, robot, IRIS(ok), Turrent robot, stage, Turrent robot, robot, IRL, robot, IRIS(ok), robot}, according to target position data XIRIS={0,0,0,0,0,IRIS(NG),0,0,0,0,0,0, 0,0,0, 0,0,0}, the reticle position data when particles are present on the surface of the reticle for the first time may be determined as {robot, library, robot}.

Figure 2:
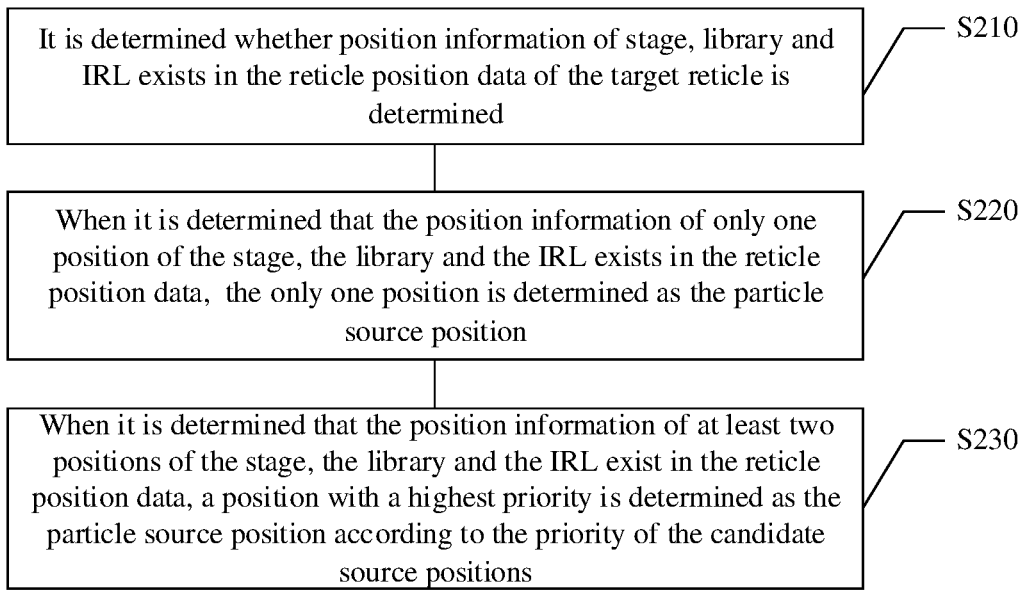
FIG. 2 shows a sub-flowchart of a positioning method for particles on a reticle according to an exemplary implementation.

By studying the source positions of particles of the target reticle within a time period, those skilled in the art found that the possibility that particles are present at a position stage is greater than the possibility that particles are present at a position library, and the possibility that particles are present at a position library is greater than the possibility that particles are present at a position IRL. Thus, a position priority of stage is considered to be higher than a position priority of library, and a position priority of library is higher than a position priority of IRL. Hence, as shown in FIG. 2, S130 may be implemented by the following steps of S210 to S230.

At S210, it is determined whether position information of stage, library and IRL exists in the reticle position data of the target reticle within adjacent scan moments is determined.

At S220, when it is determined that the position information of only one of the stage, library and IRL exists in the reticle position data, any one of the above positions is determined as a particle source position of the target reticle.

At S230, when it is determined that the position information of at least two positions of the stage, library, or IRL exists in the reticle position data, a position with a highest priority is determined as the above particle source position according to the priority.

It is to be noted that the above-mentioned position sources of particles are only an exemplary description. According to actual application scenarios, the source positions of particles may also include specific positions of a plurality of machines, such as a plurality of mechanical arms, and a plurality of internal positions of the machines.

Figure 3:
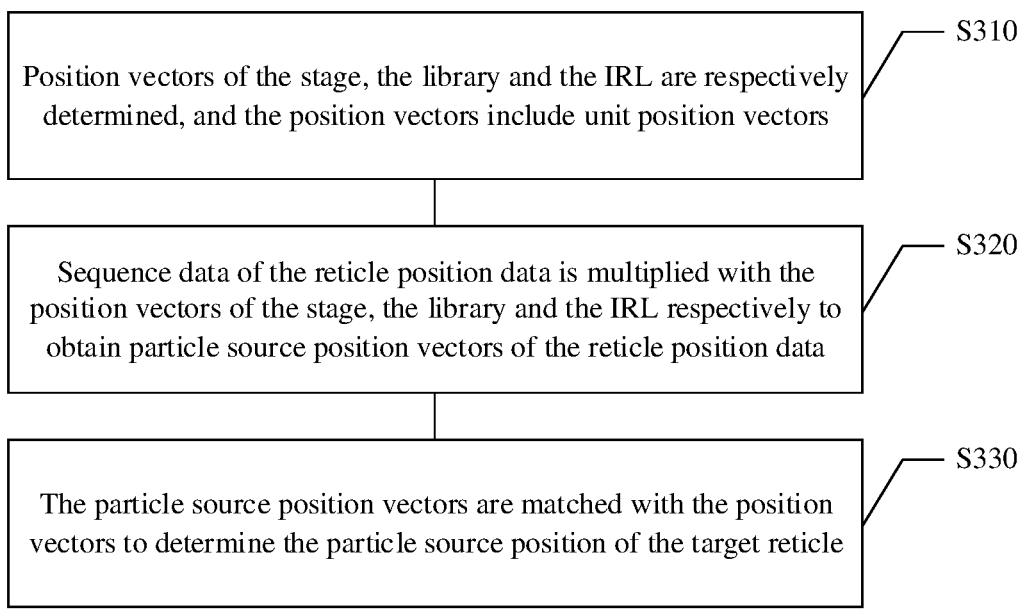
FIG. 3 shows a sub-flowchart of another positioning method for particles on a reticle according to an exemplary implementation.

Further, in order to facilitate calculation of the particle source position of the target reticle, in an alternative implementation mode, as shown in FIG. 3, S130 may be implemented by the following steps of S310 to S330.

At S310, position vectors of the above stage, library and IRL are respectively determined, and the position vectors may include unit position vectors.

At S320, sequence data of the above reticle position data is multiplied with the above position vectors of the stage, library and IRL respectively to obtain particle source position vectors of the reticle position data; and the sequence data may refer to reticle position data of the target reticle within adjacent scan moments. For example, for the data of positions of the target reticle at each moment X={robot, IRIS(ok), robot, library, robot, IRIS(NG), robot, IRL, robot, IRIS(ok), Turrent robot, stage, Turrent robot, robot, IRL, robot, IRIS(ok), robot}, the sequence data may refer to position data of the target reticle between a position IRIS (NG) where particles are present during scanning and a previous scan IRIS(ok), and sequence data A={robot, library, robot}.

At S330, the above particle source position vectors are matched with the position vectors to determine the particle source position of the target reticle.

In this exemplary implementation mode, the above position vectors of the stage, library and IRL may be determined according to position priorities of the particle source positions. Taking a unit position vector as an example, the above position vector of stage may be $\overrightarrow{IP}_k=[1,0,0]$; the above position vector of library may be $\overrightarrow{IP}_k=[0,1,0]$; and the above position vector of IRL may be $\overrightarrow{IP}_k=[0,0,1]$. By multiplying the above sequence data of the reticle position data with the above position vectors, the particle source position vectors of the above reticle position data may be obtained. For example, assuming that the reticle position data is $A_k^{ik}=\{x^i(IR_i=1)(IS_i=1), x^{i+1}(IR_{i+1}=1)(IS_{i+1}=1) \ldots x^{k-1}(IR_{k-1}=1)(IS_{k-1}=1), x^k(IR_k=1)(IS_k=1)\}$, where i≠k, and i<k, then a vector of a $k^{th}$ particle source position of the particles on the target reticle is $PSK=\overrightarrow{IP}_k \times A_k^{ik}$, where I≠k, i<k, and i and k are both positive integers. Therefore, position information of the target reticle within each adjacent scan moment may be determined according to the particle source position vectors, and the position information may be matched with the above position information of stage, library and IRL to determine the particle source position of the target reticle during each time period.

For example, for the sequence data A={robot, library, robot}, by multiplying it with the above position vectors, the particle source position vectors [robot,0,0], [0, library, 0] and [0, 0, robot] when particles are present on the surface of the reticle for the first time may be obtained, and further, by matching these vectors with the above-mentioned position vectors, the particle source position when articles are present on the surface of the target reticle for the first time may be obtained as [0, library, 0].

Through the reticle position data within adjacent scan moments, and by the method of determining a particle source position of the particles on the surface of the target reticle from the reticle position data according to a priority, positions where particles are present on the surface of the target reticle may be rapidly positioned from the data of positions of the target reticle, the operator does not need to manually check the various positions of the machine, so that workload of the operator is greatly reduced, and moreover, the operator can handle at the corresponding positions according to the position sources of particles, thereby avoiding further losses.

At S140, a particle position analysis report of the target reticle within the above preset period of time is generated according to the particle source position of the target reticle.

The particle position analysis report may be in any format, such as word, PDF, Excel, or web page format.

After the particle source position of the target reticle is obtained, position distribution of the reticle within the above preset period of time can be calculated according to the particle source position within each adjacent scan moment, and the particle position analysis report may be generated according to the position distribution.

Specifically, in an alternative implementation mode, S140 may be implemented by the following ways.

Particle position indexes of the target reticle within the preset period of time are calculated according to the particle source position of the target reticle, so as to generate a particle position analysis report on the particle position indexes;

The particle position indexes may include any one or more of: a number of positions where particles are present on the target reticle in each lithography machine, a ratio for the particle source position when particles are present on the target reticle in each lithography machine, a number of particles on the target reticle before exposure, a number of particles on the target reticle after exposure, a distribution of the particle source position of the particles on the target reticle in each lithography over time, and a particle increase rate of the target reticle.

The following is a description of each of the above particle position indexes.

1. Number of Positions where Particles are Present on Target Reticle in Each Lithography Machine Specifically, the number of positions where particles are present on the surface of the target reticle in each lithography machine may be calculated by equation (1):

$$\text{Count}_j = \Sigma_i [PS_k]_{i,j} \qquad (1),$$

where j is a particle source position, which may be, such as stage, library and IRL. For example, j=1 may represent stage, j=2 may represent library, j=3 may represent IRL; i represents moment, k represents a $k^{th}$ particle source position. It is to be understood that the foregoing ways of representing each particle source position is only an exemplary description, and this exemplary implementation mode is not limited to this specifically.

Figure 4:
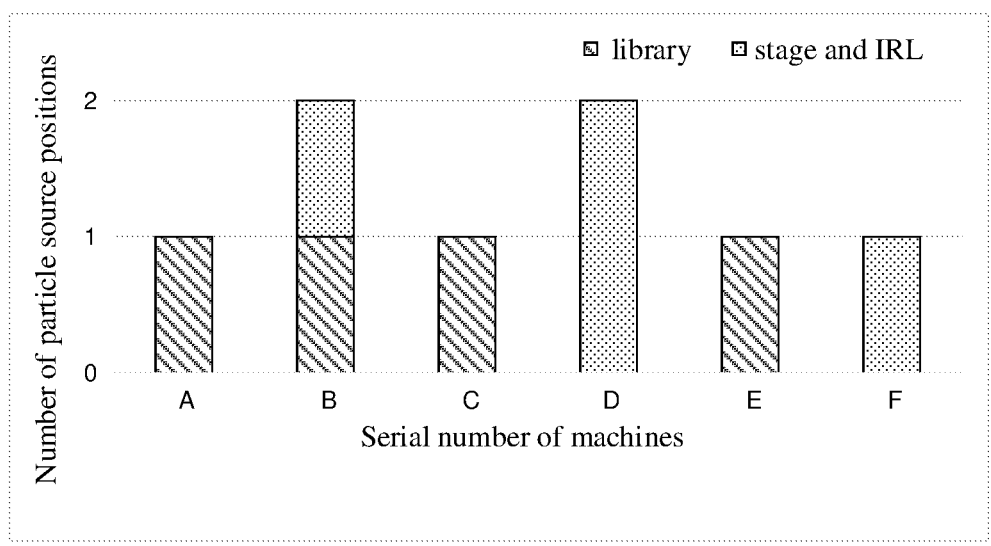
FIG. 4 shows a schematic diagram of the number of source positions of particles according to an exemplary implementation.

FIG. 4 shows the number of source positions of particles on a surface of a target reticle. It can be seen that the number of source positions of particles on the surface of the reticle in the machines with machine number A, B, C, D, E and F is 1, 2, 1, 2, 1, 1, sequentially.

2. Ratio for the Particle Source Position of Target Reticle in Each Lithography Machine Specifically, the ratio for the particle source position of the particles on the surface of the target reticle in each lithography machine may be obtained by equation (2):

$$NGR_j = \frac{\Sigma_i [PS_k]_{i,j}}{N}, \qquad (2)$$

where N is the sum of scanning times of a corresponding machine, j is a particle source position, i represents a moment, and k represents a $k^{th}$ particle source position.

Figure 5:
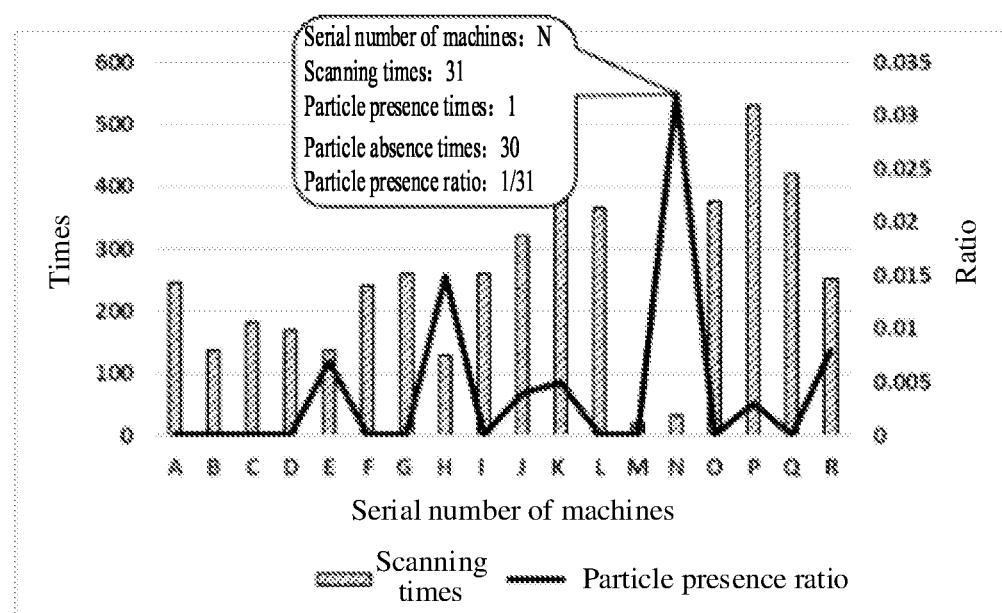
FIG. 5 shows a schematic diagram showing a ratio for a particle source position according to an exemplary implementation.

As shown in FIG. 5, the scanning times of each lithography machine and the ratio for the particle source position of the particles on the surface of the target reticle are shown. It can be seen that for the lithography machine with machine number N, the ratio of particles present is the number of time 1 particles present on the surface of the target reticle/the total scanning times 31 of the lithography machine=3.125%.

For further example, assuming that in a time period, the total scanning times of the target reticle is 300, and a number of times that particles are present on the surface of the target reticle is 6, where, if $\Sigma_i[PS_k]_{i,1}=3$, it means that among the above 6 times, there are a total of 3 times that the particle source position is stage. If $\Sigma_i[PS_k]_{i,2}=2$, it means that there are 2 times that the particle source position is library. If $\Sigma_i[PS_k]_{i,3}=1$, it means that there is 1 time that the particle source position is IRL. Thus, the following may be obtained: the ratio of the particle source position being stage as is 3/300=1%, the ratio of the particle source position being library is 2/300≈0.67%, and the ratio of the particle source position being IRL is 1/300≈0.33%.

Figure 6:
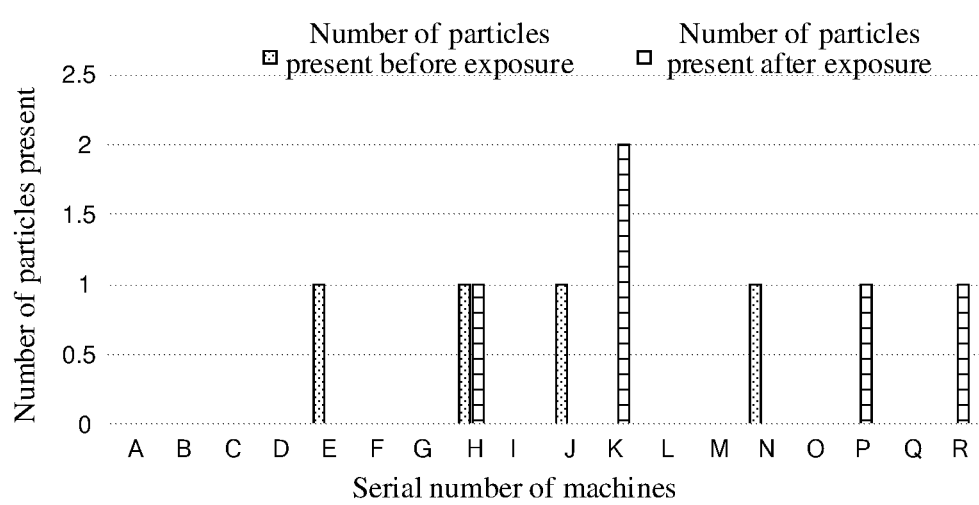
FIG. 6 shows a schematic diagram of the number of particles present before and after exposure according to an exemplary implementation.

3. Number of Particles on Target Reticle Before Exposure, and Number of Particles on the Target Reticle after Exposure By means of statistics, the number of particles in the target reticle before or after exposure in each lithography machine can be obtained. For example, as shown in FIG. 6, the number of particles in the target reticle before exposure in a machine E is 1, and the number of particles present in the reticle is 0 after exposure. For another example, for a machine H, the number of particles present on the surface of the reticle before exposure and the number of particles present on the surface of the reticle after exposure are both 1.

Figure 7:
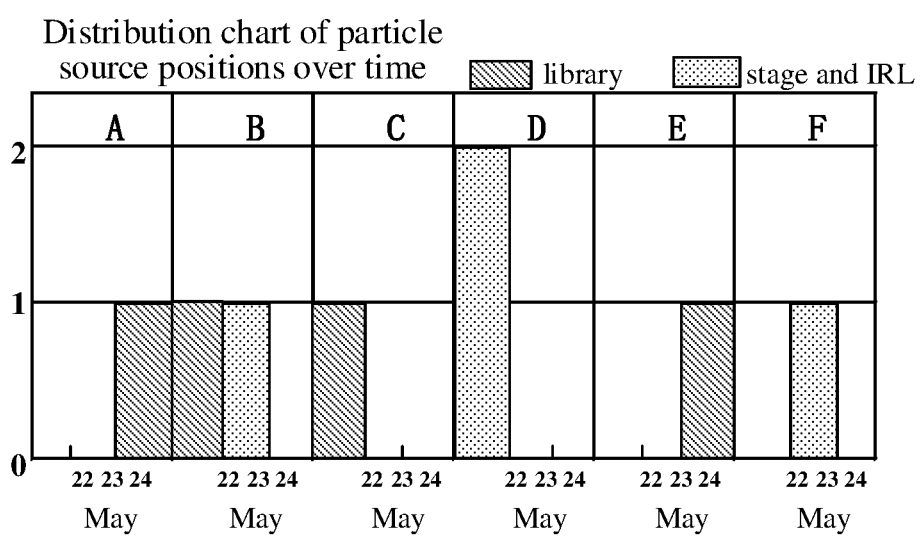
FIG. 7 shows a schematic diagram showing a distribution of particle source positions over time according to an exemplary implementation.

4. Distribution of Particle Source Positions of Particles on Surface of Target Reticle Over Time By counting scan moment data when particles are present on the surface of the target reticle, the distribution of the particles on the surface of the target reticle over time can be determined. For example, as shown in FIG. 7, it can be seen that for a machine D, the time when particles are present on the surface is May 22, and during this period, a particle source position of the particles on the surface of the target reticle is library, substantially.

5. Particle Increase Rate of Target Reticle

Figure 8:
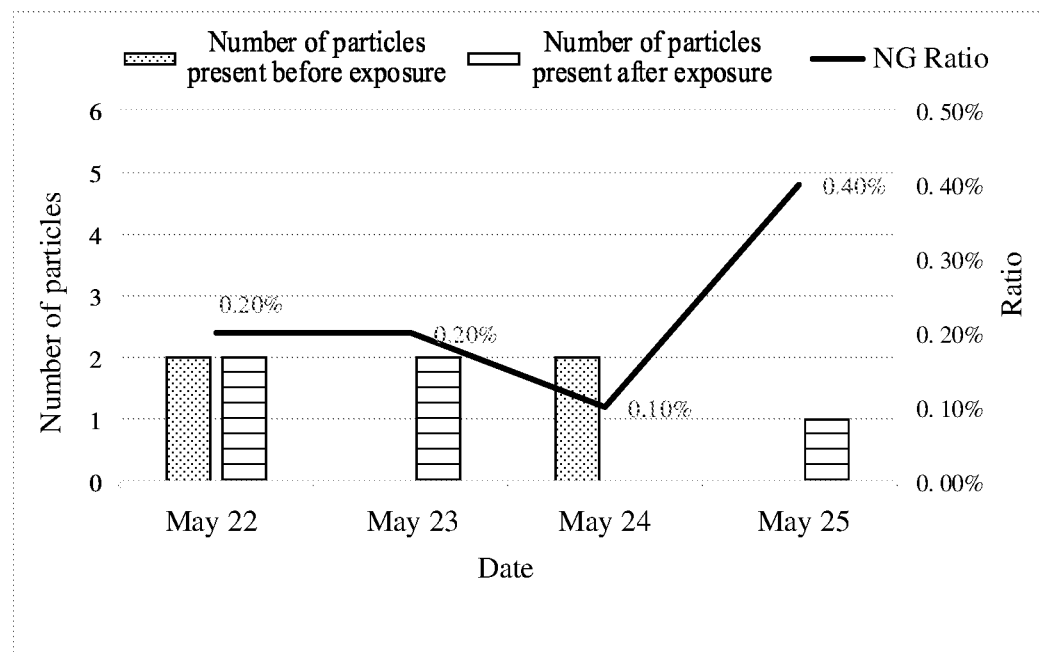
FIG. 8 shows a schematic diagram of a particle increase rate according to an exemplary implementation.

By counting the number of particles present on the surface of the target reticle, A particle increase rate of the target reticle can be obtained. For example, referring to FIG. 8, the particle increase rate is up to 0.3%, from May 24 to May 25. It is to be noted that the particle increase rate shown in FIG. 8 is only an exemplary description. According to actual requirements, the particle increase rate may also include an increase rate, at each position, of a particle source position of the particles on the surface of the target reticle, for example, it may include an increase rate, on stage or IRL, of a position source of particles on the surface of the target reticle, and the like.

By the method of generating the particle position analysis report on the particle position indexes, the efficiency of determining the particle source position and a visualization degree of particle position analysis results may be improved, and moreover, a technical support is provided for the operator to further make the dust prevention strategies of the lithography machine.

Further, after the particle increase rate of the target reticle is determined by the above-mentioned particle position indexes, the target reticle can also be warned according to the particle increase rate, specifically, in an alternative implementation mode, the warning may be implemented by the following ways.

When it is determined, according to the above particle position analysis report, that the particle increase rate of the target reticle in any one or more lithography machines is greater than a preset threshold, early warning information of the target reticle is generated.

The preset threshold may generally be set by the operator based on his experience, for example, it may be set to 0.2%, 0.3%, or the like; the warning information may be a reminder that the particle increase rate of the target reticle exceeds a normal range, and may include information of the target reticle such as an identifier, a current position, and a particle increase rate.

When it is determined, according to the particle position analysis report, that the particle increase rate of the target reticle in any one or more machines is greater than the preset threshold, that is, the ratio of particles present at a moment t minus the ratio of particles present at a moment t−1 is greater than the preset threshold, which means that the probability that the target reticle is contaminated with particles in a corresponding machine and affects the wafer yield has exceeded a normal range, and the early warning information can be generated based on the identifier, current position and particle increase rate of the target reticle, and the like, so as to remind the operator to further perform operations such as cleaning the target reticle in the corresponding machine to avoid greater losses in actual production.

In summary, according to the positioning method for particles on a reticle in the exemplary implementation modes, data of positions passed by a target reticle within a preset period of time may be determined according to path data of the target reticle; position information of the target reticle when particles are present on a surface of the target reticle may be determined according to the position data, so as to obtain target position data of the target reticle, so that reticle position data of the target reticle within adjacent scan moments may be determined according to the target position data, and a particle source position of the particles on the surface of the target reticle may be determined from the reticle position data according to position priorities; and a particle position analysis report of the target reticle within the preset period of time may be generated according to the particle source position of the target reticle. In one aspect, according to the exemplary implementation modes, by determining the reticle position data within the adjacent scan moments, and determining the particle source position from the reticle position data according to the position priority, rapid positioning of the particles on the surface of the reticle may be achieved, so that the operator may perform corresponding operations according to the particle source position, avoiding causing more losses in wafer processing. In another aspect, by generating the particle position analysis report of the reticle within the preset period of time, the efficiency of determining the particle source position may be improved, which may assist the operator in analyzing the source positions of particles better within a time period, and provide a theoretical basis for the operator to make corresponding dust prevention strategies. In still another aspect, by determining the position information when particles are present on the surface of the reticle, the position of the reticle when particles are present on the surface of the reticle may be rapidly positioned from the data of positions of the reticle, thereby further improving the efficiency of determining the particle source.

Figure 9:
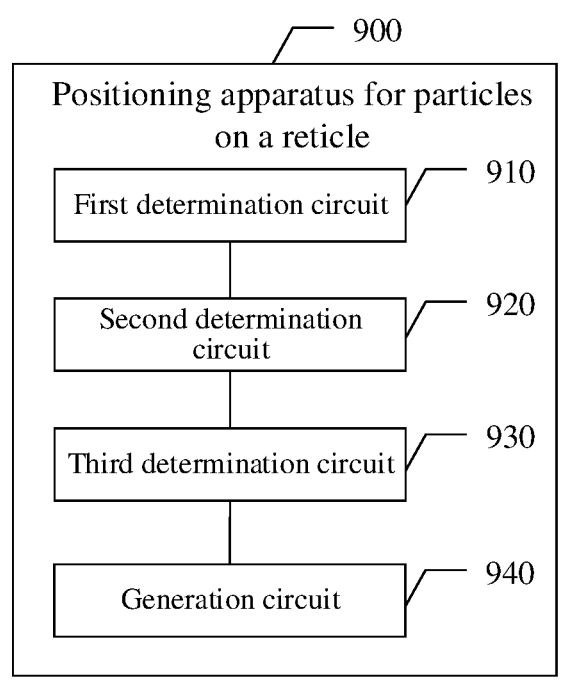
FIG. 9 shows a block diagram of a positioning apparatus for particles on a reticle according to an exemplary implementation.

Further, the exemplary implementation mode further provides a positioning apparatus for particles on a reticle. As shown in FIG. 9, the positioning apparatus for particles on a reticle 900 may include: a first determination module 910, configured to determine data of positions passed by a target reticle within a preset period of time according to path data of the target reticle, the data of positions including particle information of the target reticle at each scan moment; a second determination module 920, configured to determine position information of the target reticle when particles are present on a surface of the target reticle according to the data of positions, so as to obtain target position data of the target reticle; a third determination module 930, configured to determine reticle position data of the target reticle within adjacent scan moments according to the target position data, and determine a particle source position of the particles on the surface of the target reticle from the reticle position data according to position priorities; and a generation module 940, configured to generate a particle position analysis report of the target reticle within the preset period of time according to the particle source position of the target reticle.

According to an exemplary implementation of the disclosure, the second determination module 920 may be configured to determine whether particles are present on the surface of the target reticle at each scan moment according to the data of positions, and when it is determined that particles are present on the target reticle at a corresponding scan moment, determine position information of the target reticle at the scan moment, so as to obtain the target position data of the target reticle.

According to an exemplary implementation of the disclosure, the third determination module 930 may be configured to determine data of positions of the target reticle at each moment of the adjacent scan moments according to the target position data so as to obtain the reticle position data of the target reticle, and determine candidate particle source positions from the reticle position data, so as to determine a position with a highest priority, among the candidate source positions, as a particle source position.

According to an exemplary implementation of the disclosure, the candidate source positions include stage, library and IRL. The third determination module 930 may also be configured to determine whether position information of the stage, library and IRL exists in the reticle; when it is determined that the position information of only one position of the stage, library and IRL exists in the reticle position data, determine the only one position as a particle source position; and when it is determined that the position information of at least two positions of the stage, library and IRL exist in the reticle position data, determine a position with a highest priority as a particle source position according to priorities of the candidate source positions.

According to an exemplary implementation of the disclosure, the third determination module 930 may also be configured to respectively determine position vectors of the stage, library and IRL, the position vectors including unit position vectors; multiply sequence data of the reticle position data with the position vectors of the stage, library and IRL to obtain particle source position vectors of the reticle position data; and match the particle source position vectors with the position vectors to determine the particle source position.

According to an exemplary implementation of the disclosure, the generation module 940 may be configured to calculate particle position indexes of the target reticle within the preset period of time according to the particle source position of the target reticle, so as to generate a particle position analysis report on the particle position indexes, herein the particle position indexes include any one or more of: a number of positions where particles are present on the target reticle in each lithography machine, a ratio for the particle source position of the target reticle in each lithography machine, a number of particles on the target reticle before exposure, a number of particles on the target reticle after exposure, a distribution of the particle source position of the particles on the surface of the target reticle over time, and a particle increase rate of the target reticle.

According to an exemplary implementation of the disclosure, after generating the particle position analysis report of the target reticle within the preset period of time, the generation module 940 may also be configured to, when it is determined, according to the particle position analysis report, that the particle increase rate of the target reticle in any one or more lithography machines is greater than a preset threshold, generate early warning information of the target reticle.

The specific details of each module in the above apparatus have been described in detail in the implementation modes of the method part, and the details of the undisclosed solution can be referred to the content of the implementation modes of the method part, and thus will not be elaborated here.

Those skilled in the art will appreciate that various aspects of the disclosure may be implemented as a system, method, or program product. Therefore, various aspects of the disclosure may be embodied in the form of: an entire hardware implementation mode, an entire software implementation mode (including firmware, microcode, and the like), or an implementation mode combining hardware and software aspects, which may be collectively called a "circuit", "module", or "system" herein.

The exemplary implementation mode of the disclosure further provides a computer-readable storage medium on which a program product capable of implementing the above method in the specification is stored. In some possible implementation modes, various aspects of the disclosure may also be implemented in the form of a program product, including a program code. When the program product is run on the terminal device, the program code is configured to enable the terminal device to perform the steps according to various exemplary implementation modes of the disclosure described in the above "exemplary method" section of the specification.

Figure 10:
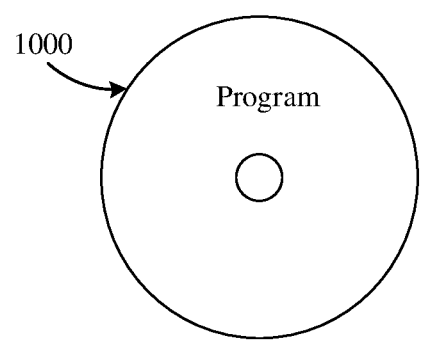
FIG. 10 shows a computer-readable storage medium for implementing the above method in an exemplary implantation mode.

Referring to FIG. 10, the program product 1000 for implementing the above data analysis method according to the exemplary implementation mode of the disclosure is described. The program product may employ a portable Compact Disc Read-Only Memory (CD-ROM) and includes a program code, and may be run on the terminal device, for example, a personal computer. However, the program product of the disclosure is not limited herein, and in the document, the readable storage medium may be any tangible medium that contains or stores a program. The program may be used by or in combination with an instruction execution system, apparatus, or device.

The program product 1000 may employ any combination of one or more readable media. The readable medium may be a readable signal medium or a readable storage medium. For example, the readable storage medium may be, but is not limited to, an electrical, magnetic, optical, electromagnetic, infrared, or semiconductor system, apparatus, or device, or any combination thereof. More specific examples (a non-exhaustive list) of the readable storage medium include: an electrical connection having one or more wires, a portable disk, a hard disk, a Random Access Memory (RAM), a Read-Only Memory (ROM), an Erasable Programmable Read-Only Memory (EPROM or Flash memory), an optical fiber, a portable Compact Disk Read-Only Memory (CD-ROM), an optical storage device, a magnetic storage device, or any suitable combination thereof.

The computer-readable signal medium may include a data signal propagating in baseband or as part of a carrier wave. The data signal carries a readable program code. Such propagated data signal may be in various forms, including but not limited to an electromagnetic signal, an optical signal, or any suitable combination thereof. The readable signal medium may also be any readable medium in addition to the readable storage medium. The readable medium may send, propagate, or transmit the program used by or in combination with the instruction execution system, apparatus, or device.

The program code contained on the readable medium may be transmitted through any suitable medium including, but not limited to, wireless, wired, fiber optic, RF, and the like, or any suitable combination thereof.

The program code for performing an operation of the disclosure may be written in any combination of one or more programming languages. The programming language includes an object-oriented programming language such as Java, C++, and the like, as well as a conventional procedural programming language such as a "C" language or a similar programming language. The program code may be executed entirely on a user computing device, partially on a user device, as a stand-alone software package, partially on a user computing device, partially on a remote computing device, or entirely on a remote computing device or server. In the case of the remote computing device, the remote computing device may be connected with the user computing device through any kind of network, including a Local Area Network (LAN) or a Wide Area Network (WAN), or may be connected with the external computing device (for example, connected through the Internet using an Internet service provider).

The exemplary implementation mode of the disclosure further provides an electronic device capable of implementing the above data analysis method. Hereinafter, the electronic device 1100 according to the exemplary implementation mode of the disclosure will be described with reference to FIG. 11. The electronic device 1100 shown in FIG. 11 is only an example and any limitation should not be imposed on the function and use scope of the implementation mode of the disclosure.

Figure 11:
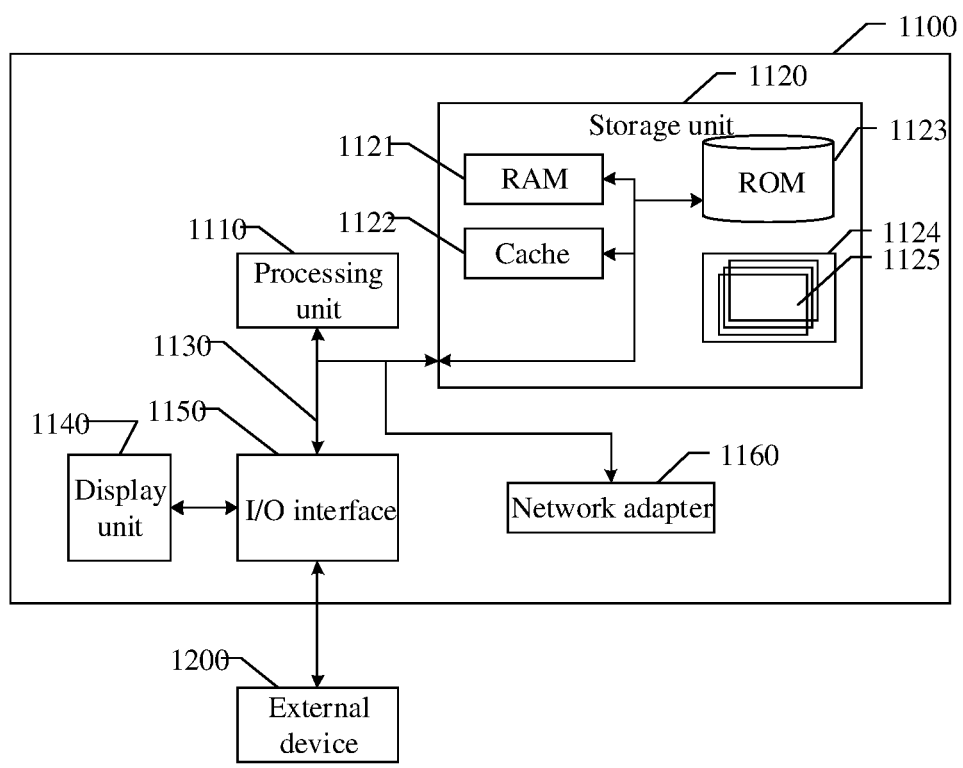
FIG. 11 shows an electronic device for implementing the above method in an exemplary implantation mode.

As shown in FIG. 11, the electronic device 1100 may be expressed in the form of a general purpose computing device. Components of the electronic device 1100 may include, but are not limited to: the at least one processing unit 1110, the at least one storage unit 1120, a bus 1130 connecting different system components (including the storage unit 1120 and the processing unit 1110), and a display unit 1140.

The storage unit stores 1120 a program code. The program code may be executed by the processing unit 1110, so that the processing unit 1110 performs the steps according to various exemplary implementation modes of the disclosure described in the above "exemplary method" section of the specification. For example, the processing unit 1110 may execute the method steps shown in FIG. 1 to FIG. 3, and the like.

The storage unit 1120 may include a readable medium in the form of a volatile storage unit, for example, a Random Access Memory (RAM) 1121 and/or a cache storage unit 1122, and may further include a Read-Only Memory (ROM) 1123.

The storage unit 1120 may further include a program/utility 1124 having a set (at least one) of program modules 1125. Such program module 1125 includes, but is not limited to: an operating system, one or more applications, other program modules, and program data. Each or a certain combination of these examples may include the implementation of a network environment.

The bus 1130 may be expressed as one or more of several types of bus structures, including a storage unit bus or a storage unit controller, a peripheral bus, an accelerated graphics port, a processing unit 1110, or a local bus using any bus structure in a plurality of bus structures.

The electronic device 1100 may also communicate with one or more peripheral devices 1200 (for example, a keyboard, a pointing device, a Bluetooth device, and the like), may also communicate with one or more devices that enable a user to interact with the electronic device 1100, and/or may communicate with any device (for example, a router, a modem, and the like) that enables the electronic device 1100 to communicate with one or more other computing devices. Such communication may be performed through the input/output (I/O) interface 1150. Furthermore, the electronic device 1100 may also communicate with one or more networks (for example, a Local Area Network (LAN), a Wide Area Network (WAN), and/or a public network, for example, the Internet) through a network adapter 1160. As shown in figures, the network adapter 1160 communicates with other modules of the electronic device 1100 through the bus 1130. It is to be understood that although not shown in the drawings, the electronic device 1100 may be used with other hardware and/or software modules, including but not limited to: a microcode, a device driver, a redundant processing unit, an external disk drive array, a RAID system, a tape driver, and a data backup storage system.

It is to be noted that although in the above detailed description, reference has been made to a number of modules or units of the device for executing actions, such division is not mandatory. Indeed, according to the exemplary implementation mode of the disclosure, the features and functions of two or more modules or units described above may be embodied in one module or unit. On the contrary, the features and functions of one module or unit described above may further be divided to be embodied by a plurality of modules or units.

In addition, the above drawings are only schematic illustrations of the processing involved in the method according to the exemplary implementation mode of the disclosure, and are not intended to limit. It is easy to understand that the processing shown in the above drawings do not indicate or limit the time sequence of the processing. Moreover, it is also easy to understand that the processing may be performed synchronously or asynchronously, for example, in a plurality of modules.

From the above description of the implementation mode, those skilled in the art are easy to understand that the exemplary implementation mode described herein may be implemented through software or may also be implemented through the software in combination with necessary hardware. Therefore, the technical solution according to the exemplary implementation mode of the disclosure may be embodied in the form of a software product. The software product may be stored in a non-volatile storage medium (which may be a CD-ROM, a U-disk, a mobile hard disk, and the like) or on a network, and may include a number of instructions, so that a computing device (which may be a personal computer, a server, a terminal device, or a network device, and the like) executes the method according to the exemplary implementation mode of the disclosure.

Other implementation modes of the disclosure will be apparent to those skilled in the art from consideration of the specification and practice of the disclosure disclosed herein. The disclosure is intended to cover any variations, uses, or adaptations of the disclosure, and the variations, uses, or adaptations follow the general principles of the disclosure and include common general knowledge or conventional technical means in the art undisclosed by the disclosure. The specification and implementation modes are considered as examples only, and a true scope and spirit of the disclosure are indicated by the claims.

The invention claimed is:

1. A positioning method for particles on a reticle, comprising:
   determining data of positions passed by a target reticle within a preset period of time according to path data of the target reticle, the data of positions comprising particle information of the target reticle at each scan moment;
   determining position information of the target reticle when particles are present on a surface of the target reticle according to the data of positions, so as to obtain target position data of the target reticle;
   determining reticle position data of the target reticle within adjacent scan moments according to the target position data, and determining a particle source position of the particles on the surface of the target reticle from the reticle position data according to position priorities; and
   generating a particle position analysis report of the target reticle within the preset period of time according to the particle source position of the target reticle.

2. The positioning method of claim 1, wherein determining the position information of the target reticle when particles are present on the surface of the target reticle according to the data of positions, so as to obtain the target position data of the target reticle comprises:
   determining whether particles are present on the surface of the target reticle at each scan moment according to the data of positions; and
   when it is determined that particles are present on the target reticle at a corresponding scan moment, determining position information of the target reticle at the scan moment, so as to obtain the target position data of the target reticle.

3. The positioning method of claim 1, wherein determining the reticle position data of the target reticle within adjacent scan moments according to the target position data, and determining the particle source position of the particles on the surface of the target reticle from the reticle position data according to the position priorities comprises:
   determining position information of the target reticle at each moment of the adjacent scan moments according to the target position data, to obtain the reticle position data of the target reticle; and
   determining candidate particle source positions from the reticle position data, so as to determine a position with a highest priority, among the candidate particle source positions, as the particle source position.

4. The positioning method of claim 3, wherein the candidate particle source positions comprise stage, library, and Internal Reticle Library (IRL), and determining the candidate particle source positions from the reticle position data, so as to determine the position with the highest priority, among the candidate particle source positions, as the particle source position comprises:
   determining whether position information of the stage, the library and the IRL exists in the reticle position data;
   when it is determined that the position information of only one position of the stage, the library and the IRL exists in the reticle position data, determining the only one position as the particle source position; and
   when it is determined that the position information of at least two positions of the stage, the library and the IRL exist in the reticle position data, determining a position with a highest priority as the particle source position according to priorities of the candidate particle source positions.

5. The positioning method of claim 4, wherein determining the candidate particle source positions of the particle source from the reticle position data, so as to determine the position with the highest priority, among the candidate particle source positions, as the particle source position further comprises:
   respectively determining position vectors of the stage, the library and the IRL, the position vectors comprising unit position vectors;
   multiplying sequence data of the reticle position data with the position vectors of the stage, the library and the IRL to obtain particle source position vectors of the reticle position data; and
   matching the particle source position vectors with the position vectors to determine the particle source position.

6. The positioning method of claim 1, wherein generating the particle position analysis report of the target reticle within the preset period of time according to the particle source position of the target reticle comprises:

calculating particle position indexes of the target reticle within the preset period of time according to the particle source position of the target reticle, so as to generate a particle position analysis report on the particle position indexes, wherein the particle position indexes comprise any one or more of: a number of positions where particles are present on the target reticle in each lithography machine, a ratio for the particle source position of the target reticle in each lithography machine, a number of particles on the target reticle before exposure, a number of particles on the target reticle after exposure, a distribution of the particle source position of the particles on the surface of the target reticle over time, and a particle increase rate of the target reticle.

7. The positioning method of claim 6, further comprising: after generating the particle position analysis report of the target reticle within the preset period of time, when it is determined, according to the particle position analysis report, that the particle increase rate of the target reticle in any one or more lithography machines is greater than a preset threshold, generating early warning information for the target reticle.

8. A non-transitory computer-readable storage medium having stored thereon computer-executable instructions that, when executed by a processor, cause the processor to perform the method of claim 1.

9. A positioning apparatus for particles on a reticle, comprising:

a first determination circuit, configured to determine data of positions passed by a target reticle within a preset period of time according to path data of the target reticle, the data of positions comprising particle information of the target reticle at each scan moment;

a second determination circuit, configured to determine position information of the target reticle when particles are present on a surface of the target reticle according to the data of positions, so as to obtain target position data of the target reticle;

a third determination circuit, configured to determine reticle position data of the target reticle within adjacent scan moments according to the target position data, and determine a particle source position of the particles on the surface of the target reticle from the reticle position data according to position priorities; and a generation circuit, configured to generate a particle position analysis report of the target reticle within the preset period of time according to the particle source position of the target reticle.

10. An electronic device, comprising:

a processor; and a memory, configured to store instructions executable by the processor, wherein the processor is configured to perform the following operations by executing the instructions:

determining data of positions passed by a target reticle within a preset period of time according to path data of the target reticle, the data of positions comprising particle information of the target reticle at each scan moment;

determining position information of the target reticle when particles are present on a surface of the target reticle according to the data of positions, so as to obtain target position data of the target reticle;

determining reticle position data of the target reticle within adjacent scan moments according to the target position data, and determining a particle source position of the particles on the surface of the target reticle from the reticle position data according to position priorities; and generating a particle position analysis report of the target reticle within the preset period of time according to the particle source position of the target reticle.

11. The electronic device of claim 10, wherein determining the position information of the target reticle when particles are present on the surface of the target reticle according to the data of positions, so as to obtain the target position data of the target reticle comprises:

determining whether particles are present on the surface of the target reticle at each scan moment according to the data of positions; and when it is determined that particles are present on the target reticle at a corresponding scan moment, determining position information of the target reticle at the scan moment, so as to obtain the target position data of the target reticle.

12. The electronic device of claim 10, wherein determining the reticle position data of the target reticle within adjacent scan moments according to the target position data, and determining the particle source position of the particles on the surface of the target reticle from the reticle position data according to the position priorities comprises:

determining position information of the target reticle at each moment of the adjacent scan moments according to the target position data, to obtain the reticle position data of the target reticle; and determining candidate particle source positions from the reticle position data, so as to determine a position with a highest priority, among the candidate particle source positions, as the particle source position.

13. The electronic device of claim 12, wherein the candidate particle source positions comprise stage, library, and Internal Reticle Library (IRL), and determining the candidate particle source positions from the reticle position data, so as to determine the position with the highest priority, among the candidate particle source positions, as the particle source position comprises:

determining whether position information of the stage, the library and the IRL exists in the reticle position data;

when it is determined that the position information of only one position of the stage, the library and the IRL exists in the reticle position data, determining the only one position as the particle source position; and when it is determined that the position information of at least two positions of the stage, the library and the IRL exist in the reticle position data, determining a position with a highest priority as the particle source position according to priorities of the candidate particle source positions.

14. The electronic device of claim 13, wherein determining the candidate particle source positions of the particle source from the reticle position data, so as to determine the position with the highest priority, among the candidate particle source positions, as the particle source position further comprises:

respectively determining position vectors of the stage, the library and the IRL, the position vectors comprising unit position vectors;

multiplying sequence data of the reticle position data with the position vectors of the stage, the library and the IRL to obtain particle source position vectors of the reticle position data; and matching the particle source position vectors with the position vectors to determine the particle source position.

15. The electronic device of claim 10, wherein generating the particle position analysis report of the target reticle within the preset period of time according to the particle source position of the target reticle comprises:
calculating particle position indexes of the target reticle within the preset period of time according to the particle source position of the target reticle, so as to generate a particle position analysis report on the particle position indexes,
wherein the particle position indexes comprise any one or more of: a number of positions where particles are present on the target reticle in each lithography machine, a ratio for the particle source position of the target reticle in each lithography machine, a number of particles on the target reticle before exposure, a number of particles on the target reticle after exposure, a distribution of the particle source position of the particles on the surface of the target reticle over time, and a particle increase rate of the target reticle.

16. The electronic device of claim 15, wherein the processor is configured to execute the instructions to further perform an operation of: after generating the particle position analysis report of the target reticle within the preset period of time,
when it is determined, according to the particle position analysis report, that the particle increase rate of the target reticle in any one or more lithography machines is greater than a preset threshold, generating early warning information for the target reticle.

* * * * *